(12) United States Patent
Jablonski et al.

(10) Patent No.: US 9,428,825 B1
(45) Date of Patent: Aug. 30, 2016

(54) MCRALY BOND COAT WITH ENHANCED YTTRIUM

(75) Inventors: Paul D. Jablonski, Salem, OR (US); Jeffrey A. Hawk, Corvallis, OR (US)

(73) Assignee: U.S. Department of Energy, Washington, DC (US)

( * ) Notice: Subject to any disclaimer, the term of this patent is extended or adjusted under 35 U.S.C. 154(b) by 363 days.

(21) Appl. No.: 13/363,486

(22) Filed: Feb. 1, 2012

(51) Int. Cl.
*B05D 3/02* (2006.01)
*B32B 15/20* (2006.01)

(52) U.S. Cl.
CPC ............... *C23C 4/073* (2016.01); *B32B 15/20* (2013.01)

(58) Field of Classification Search
CPC .............................. B32B 15/20; C23C 4/073
USPC ...................................................... 427/376.2
See application file for complete search history.

(56) References Cited

U.S. PATENT DOCUMENTS

| | | | |
|---|---|---|---|
| 6,677,064 B1 * | 1/2004 | Subramanian | C23C 28/00 416/241 B |
| 6,783,875 B2 | 8/2004 | Yamada et al. | |
| 7,368,177 B2 * | 5/2008 | Quadakkers et al. | 428/680 |
| 7,553,517 B1 * | 6/2009 | Jablonski et al. | 427/252 |
| 7,935,387 B2 | 5/2011 | Lee et al. | |
| 2008/0292873 A1 * | 11/2008 | Nijdam et al. | C23C 8/02 428/332 |

FOREIGN PATENT DOCUMENTS

WO    WO 2009/125204    * 10/2009    ............. C23C 30/00

OTHER PUBLICATIONS

Toscano et al.,"Parameters affecting TGO growth and adherence on MCrAlY-bond coats for TBC's," Surface & Coatings Technology 201 (2006).
Gil et al., "Y-rich oxide distribution in plasma sprayed MCrAlY-coatings studied by SEM with a cathodoluminescence detector and Raman spectroscopy," Surface & Coatings Technology 204 (2009).
Subanovic et al., "Effect of manufacturing related parameters on oxidation properties of MCrAlY-bondcoats," Materials and Corrosion 59 (2008).
Pint, "Optimization of Reactive-Element Additions to Improve Oxidation Performance of Alumina-Forming Alloys," J. Am. Ceram. Soc., 86 [4] (2003).

* cited by examiner

*Primary Examiner* — Tabatha Penny
(74) *Attorney, Agent, or Firm* — Jacob A. Heafner; Brian J. Lally; John T. Lucas

(57) ABSTRACT

One or more embodiments relates to a method of producing an MCrAlY bond coat comprising an MCrAlY layer in contact with a Y—$Al_2O_3$ layer. The MCrAlY layer is comprised of a γ-M solid solution, a β-MAl intermetallic phase, and Y-type intermetallics. The Y—$Al_2O_3$ layer is comprised of Yttrium atoms coordinated with oxygen atoms comprising the $Al_2O_3$ lattice. The method comprises depositing an MCrAlY material on a substrate, applying an $Y_2O_3$ paste, and heating the substrate in a non-oxidizing atmosphere at a temperature between 400-1300° C. for a time sufficient to generate the Y—$Al_2O_3$ layer. Both the MCrAlY layer and the Y—$Al_2O_3$ layer have a substantial absence of $Y_2O_3$, YAG, and YAP phases.

21 Claims, 2 Drawing Sheets

MCRALY BOND COAT WITH ENHANCED YTTRIUM

GOVERNMENT INTERESTS

The United States Government has rights in this invention pursuant to the employer-employee relationship of the Government to the inventors as U.S. Department of Energy employees and site-support contractors at the National Energy Technology Laboratory.

FIELD OF THE INVENTION

One or more embodiments relates to an MCrAlY bond coat comprised an MCrAlY layer in contact with a Y—$Al_2O_3$ layer. The MCrAlY composition is comprised of Yttrium and Aluminum, and further comprised of greater than 50 weight percent (wt. %) of a metal M, where the metal M is Ni, Co, Fe, or combinations thereof, and the MCrAlY layer is comprised of a γ-M solid solution, a β-MAl intermetallic phase, and Y-type intermetallics. The Y—$Al_2O_3$ layer is comprised of Yttrium atoms coordinated with oxygen atoms comprising the $Al_2O_3$ lattice. Both the MCrAlY layer and the Y—$Al_2O_3$ layer have a substantial absence of Y—Al oxides, providing advantage in the maintainability of the Yttrium reservoir within the MCrAlY bulk. A method of fabrication is additionally disclosed.

BACKGROUND

MCrAlY type coatings are commonly used as overlay coatings and bondcoats for the protection of components against high-temperature oxidation and corrosion. During exposure to high temperatures, an oxide scale forms on the MCrAlY surface, becoming part of the original system. This thermally grown oxide is largely comprised of alumina and often represents the starting point for failure. Correspondingly, the growth rate and adhesion of the oxide scale and the aluminum depletion in the bondcoat are among the determining factors for the useful lifetime of am MCrAlY bond coated article.

At long term exposures, the alumina scales are prone to spallation. The scale spallation is a common event under temperature cycling conditions due to the thermal expansion mismatch between the oxide and the metallic substrate, and failure is generally related to scale thickness, growth rate and adherence. The two latter parameters are crucially affected by the addition of Yttrium, as well as other reactive elements such as Lanthanum, Zirconium, and Hafnium. These reactive elements will commonly constitute some percentage, typically less than 0.5 wt. % to the base MCrAl-composition. These reactive elements have been found to greatly improve alumina scale adherence and significantly increase the critical scale thickness for spallation. However, this beneficial effect is highly sensitive to the Y-concentration. In some cases, optimum oxidation and improved adherence is obtained by low concentrations of Y in the coating (around 0.1 wt. %), whereas a few tenths of a weight percent more (over 0.5 wt. %) can lead to accelerated oxidation and detrimental oxide morphology. This implies that relatively low amounts of Yttrium are desired in the coating. Issues have arisen as a result of this Yttrium content sensitivity however, because Yttrium can be tied up by Y—Al oxides resulting from typical fabrication processes, and the effective Yttrium concentration of the MCrAlY coating may significantly deviate from that of the original MCrAlY source material.

Depletion of the Yttrium reservoir through the formation of excessive Y—Al oxides will therefore promote TGO spallation in service. Such depletion results in deviation from the optimum Yttrium content designed to obtain a compromise between the beneficial effect on oxide adherence without extensively enhancing the growth rate of the oxide. Defining and maintaining this optimum yttrium content it is absolutely necessary to take into account the actual Yttrium reservoir in the MCrAlY coating. See e.g., Toscano et al., "Parameters affecting TGO growth and adherence on MCrAlY-bond coats for TBC's," *Surface & Coatings Technology* 201 (2006), among others. It would be advantageous to provide an MCrAlY bond coat wherein the formation of Y—Al oxides is suppressed, and the Yttrium reservoir of the final heat treated composition could be largely defined by the Yttrium concentration of the original MCrAlY source material. Such an MCrAlY bond coat would mitigate variations in the Y-distribution and the reservoir of metallic Y in MCrAlY coatings and avoid the significant variations in the alumina scale growth rate and adherence which accrue from nominally equivalent MCrAlY bond coat compositions.

Additionally, a common feature of the oxide morphology in MCrAlY bond coats is the formation of $Y_2O_3$ compounds near or at the metal/oxide interface, known as pegs. The coefficient of diffusion of oxygen in $Y_2O_3$ is about $2.2 \times 10^{-11}$ cm$^2$/s, and is considerably higher than the surrounding $Al_2O_3$, where the value is generally around $1 \times 10^{-17}$ cm$^2$/s (at 700° C.). As a result, the presence of $Y_2O_3$ in the alumina scale is associated with locally accelerated oxidation along these Y-compounds, which leads to internal oxidations intruding in the coating alloy. In real oxide scales, this short-circuit path diffusion significantly impacts the kinetics of internal MCrAlY bulk oxidation. It would be additionally advantageous to provide an MCrAlY bond coat wherein an upper surface layer of Y-$Al_2O_3$ with an absence of $Y_2O_3$ could be formed, in order to mitigate internal MCrAlY bulk oxidations enabled by short-circuit path diffusion through $Y_2O_3$ in the upper layer. Such an absence of $Y_2O_3$ and other Y—Al oxides in the MCrAlY upper layer would further preserve the reservoir of metallic Y in MCrAlY coatings and promote MCrAlY effective lifetimes.

Provided here is an MCrAlY bond coat comprised of an MCrAlY layer in contact with a Y—$Al_2O_3$ layer. The MCrAlY layer is comprised of a γ-M solid solution, a β-MAl intermetallic phase, and Y-type intermetallics. The Y—$Al_2O_3$ layer is comprised of Yttrium atoms coordinated with oxygen atoms comprising the $Al_2O_3$ lattice. The MCrAlY layer and the Y—$Al_2O_3$ layer have a substantial absence of Y—Al oxides. The absence of selected Y—Al oxides within the MCrAlY layer provides advantage in the maintainability of the Yttrium reservoir within the MCrAlY bulk, and the absence of selected Y—Al oxides within the Y—$Al_2O_3$ layer mitigates oxygen diffusion and undesired modification of the originally intended Yttrium distribution in the underlying MCrAlY bulk.

These and other objects, aspects, and advantages of the present disclosure will become better understood with reference to the accompanying description and claims.

SUMMARY

The disclosure provides a bond coat comprised of an MCrAlY layer in contact with a Y—$Al_2O_3$ layer. The MCrAlY layer may be further in contact with a substrate surface. The MCrAlY layer is comprised of Yttrium and Aluminum, and further comprised of greater than 50 weight percent (wt. %) of a metal M, where the metal M is Ni, Co, Fe, or combinations thereof. In an embodiment, the MCrAlY layer is in contact with a nickel-based substrate, and the metal M is Ni, Co, or Ni and Co. The MCrAlY layer is comprised of a γ-M solid solution, a β-MAl intermetallic phase, and Y-type intermetallics, and has a substantial absence of Yttrium-Aluminum Garnet (YAG) and Yttrium-Aluminum Perovskite (YAP) phases. The Y—Al$_2$O$_3$ layer is comprised of Yttrium atoms and Al$_2$O$_3$, where the Yttrium atoms are coordinated with oxygen atoms comprising the Al$_2$O$_3$ lattice. Generally, the Y—Al$_2$O$_3$ layer is comprised of equiaxed grains of Al$_2$O$_3$ where the Al$_2$O$_3$ grain boundaries are enriched with Yttrium at grain-boundary cation sites.

Additionally, the MCrAlY layer and Y—Al$_2$O$_3$ layer have a substantial absence of various Y—Al oxide phases, as opposed to typical MCrAlY bond coats generated through the vacuum heat treatment of MCrAlY materials. The absence of these Y—Al oxides maintains the Y-oxide distribution within the MCrAlY bulk and has a significant effect on the growth rate and adherence of the alumina scale and lifetime of the bond coat. The absence of these Y—Al oxides within the MCrAlY layer and the Y—Al$_2$O$_3$ layer is both advantageous and difficult to achieve.

In a particular embodiment, MCrAlY layer 101 and Y—Al$_2$O$_3$ layer 102 are fabricated by a process of depositing an MCrAlY material on a substrate, preparing a Y$_2$O$_3$ paste comprised of a halide activator, and heat treating the article in a non-oxidizing atmosphere to generate the MCrAlY layer and the Y—Al$_2$O$_3$ layer. The Y$_2$O$_3$ paste is comprised of Y$_2$O$_3$ and a halide activator, and may be further comprised of inert filler and inert transport fluid. The halide activator may be selected from any of the activators known for use in the pack cementation technique and suitable for the production of yttrium containing vapors when placed in the presence of Y$_2$O$_3$ at sufficient temperature. The Y$_2$O$_3$, halide activator and optionally, inert filler, are combined and thoroughly mixed as required to make the Y$_2$O$_3$ paste composition. The Y$_2$O$_3$ paste is applied to the MCrAlY upper surface by any convenient, cost effective manner, and the paste covered article is heated in a non-oxidizing atmosphere at a temperature of from about 400° C. to about 1300° C. for a sufficient period of time sufficient to generate the MCrAlY layer and the Y—Al$_2$O$_3$ layer. Following the heating period, any excess remaining Y$_2$O$_3$ paste may be removed from the heat treated article, generating a bond coated article.

The novel process and principles of operation are further discussed in the following description.

DETAILED DESCRIPTION

Figure 2:
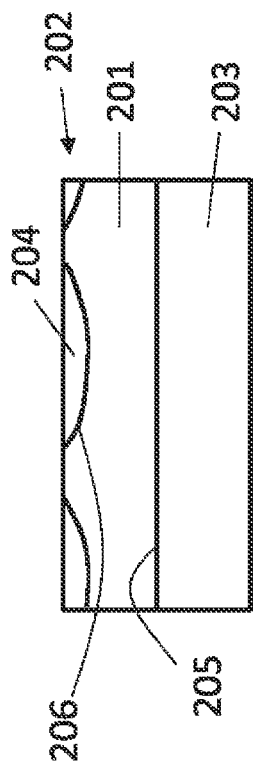
FIG. 2 illustrates a second embodiment of a bond coated article comprised of the MCrAlY layer and the Y—Al$_2$O$_3$ layer.

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to provide a bond coated article comprised of a Y—Al$_2$O$_3$ layer atop an MCrAlY layer, where the Y—Al$_2$O$_3$ layer and the MCrAlY layer have a substantial absence of Yttrium-Aluminum Garnet and Yttrium-Aluminum Perovskite phases.

The disclosure provides a bond coat comprised of an MCrAlY layer in contact with a Y—Al$_2$O$_3$ layer. The MCrAlY layer may be further in contact with a substrate surface. The MCrAlY layer is comprised of Yttrium and Aluminum, and further comprised of greater than 50 weight percent (wt. %) of a metal M, where the metal M is Ni, Co, Fe, or combinations thereof. In an embodiment, the MCrAlY layer is in contact with a nickel-based substrate, and the metal M is Ni, Co, or Ni and Co. The MCrAlY layer is comprised of a γ-M solid solution, a β-MAl intermetallic phase, and Y-type intermetallics, and has a substantial absence of Yttrium-Aluminum Garnet (YAG) and Yttrium-Aluminum Perovskite (YAP) phases. The absence of YAG and YAP phases provides advantages in Y-distribution and maintainability of the Yttrium reservoir within the MCrAlY bulk over typical MCrAlY bond coats generated through the vacuum heat treatments.

The Y—Al$_2$O$_3$ layer is comprised of Yttrium atoms and Al$_2$O$_3$, where the Yttrium atoms are coordinated with oxygen atoms comprising the Al$_2$O$_3$ lattice. The Yttrium enrichment along the grain boundaries provides significant benefit in terms of oxygen diffusivity. Additionally, the Y—Al$_2$O$_3$ layer has a substantial absence of Yttria, YAG, and YAP phases, as opposed to the typical upper layers generated through the vacuum heat treatment of MCrAlY materials. The absence of Yttria and mixed Y—Al oxide compounds in the Y—Al$_2$O$_3$ layer mitigates diffusion and undesired modification of the originally intended Yttrium distribution in the underlying MCrAlY bulk. The absence of Yttria and mixed Y—Al oxide compounds additionally reduces scale spallation due to stress concentration and thermal expansion mismatch.

Within this disclosure, the descriptive "MCrAlY" when applied to a layer or material denotes a material composition comprised of a base metal M, Chromium (Cr), Aluminum (Al), and Yttrium (Y), where the base metal M is typically Iron (Fe), Nickel (Ni), Cobalt (Co), or a combination of Ni and Co, and where the material composition is at least 50 wt. % of the base metal M, at least 10 wt. % Cr, and at least 7 wt. % Al, where the wt. % values are based on the total weight of the material composition. In an embodiment, the material composition is about 0.05 to about 1.5 wt. % yttrium. In a further embodiment, an MCrAlY material has a composition of 22 wt. % Cr, 10 wt. % Al, 1.0 wt. % Y, balance Ni. In another embodiment, an MCrAlY material has a composition of 32 wt. % Ni, 21 wt. % Cr, 8 wt. % Al, 0.5 wt. % Y, balance Co.

Within this disclosure, an "MCrAlY layer" means a layer having an MCrAlY composition and comprised of an γ-M solid solution, a fβ-MAl intermetallic phase, and Y-type intermetallics. A "γ-M solid solution" means a face-centered cubic (FCC) solid solution of the base metal M in the MCrAlY composition, where the base metal M is the solvent and Al, Cr, and possibly other elements, are the solute. "β-MAl intermetallics" means a body-centered cubic (BCC) intermetallic of the base metal M and Al. "Y-type intermetallics" means an intermetallic of Yttrium and the base metal M or other metallic elements. As is understood, typically the γ-M solid solution, a 1-MAl intermetallic phase, and Y-type intermetallics will result from the heat treatment of an MCrAlY material under specific temperature, time, and atmospheric requirements.

Within this disclosure, "YAG" means a Yttrium-Aluminum Garnet having the chemical structure $YAl_5O_{12}$, "YAP" means a Yttrium-Aluminum Perovskite having the chemical structure $YAlO_3$, and "Yttria" means a Yttrium-oxide having the chemical structure $Y_2O_3$.

Within this disclosure, a "substantial absence" of Yttria, YAG, and YAP phases within a Y—$Al_2O_3$ layer means that cathodoluminescence of the Y—$Al_2O_3$ layer generates a CL emission spectra where absorption peaks corresponding to Yttria, YAG, and YAP wavelengths are undetectable above background. Similarly, a "substantial absence" of YAG and YAP phases within a MCrAlY layer means that cathodoluminescence of the MCrAlY layer generates a CL emission spectra where absorption peaks corresponding to YAG and YAP wavelengths are undetectable above background.

The disclosure further provides a process for producing the bond coated article disclosed comprised briefly of depositing an MCrAlY material on a substrate, preparing a $Y_2O_3$ paste comprised of a halide activator, and heat treating the article in a non-oxidizing atmosphere. The process generates the MCrAlY layer and the Y—$Al_2O_3$ layer disclosed by blocking oxygen diffusion into the MCrAlY bulk during heat treatment and mitigating Yttrium diffusion toward the surface, thereby avoiding significant variation in the intended Y-distribution and the Yttrium reservoir.

Figure 1:
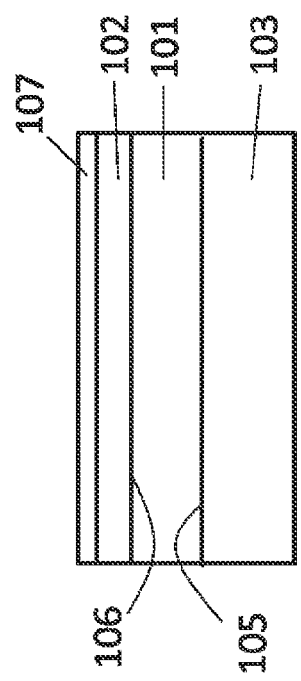
FIG. 1 illustrates an embodiment of a bond coated article comprised of the MCrAlY layer and the Y—Al$_2$O$_3$ layer.

FIG. 1 illustrates an embodiment of a bond coat having MCrAlY layer 101 in contact with substrate 103 at substrate surface 105, and further in contact with Y—$Al_2O_3$ layer 102 at MCrAlY upper surface 106, where substrate surface 105 is a surface of substrate 103 and MCrAlY upper surface is a surface of MCrAlY layer 101.

At FIG. 1, Y—$Al_2O_3$ layer 102 is comprised of Yttrium atoms and $Al_2O_3$, where the Yttrium atoms are coordinated with oxygen atoms comprising the $Al_2O_3$ lattice. Generally and without being bound by theory, Y—$Al_2O_3$ layer 102 is comprised of equiaxed grains of $Al_2O_3$ where the $Al_2O_3$ grain boundaries are enriched with Yttrium at grain-boundary cation sites. Typically the grain-boundary enrichment is reflected by an enrichment factor of at least 100, where the enrichment factor is the ratio of Yttrium concentration at grain boundaries to that within some statistically significant population of grains, with an average grain-boundary cation coverage of typically between 6 and 10%. See e.g., Thompson et al., "Dopant Distributions in Rare-Earth-Doped Alumina," *J. Am. Ceram. Soc.*, 80 [2] (1997). The Yttrium enrichment along the grain boundary provides significant benefit in terms of oxygen diffusivity within Y—$Al_2O_3$ layer 102, as is understood. In some cases, Yttrium enrichment along the grain boundaries of $Al_2O_3$ has generated diffusivities up to 10 times lower than that of pristine grain boundaries. See e.g., Nakagawa et al., "Yttrium doping effect on oxygen grain boundary diffusion in a-Al2O3," *Acta Materialia* 55 (2007).

Additionally, Y—$Al_2O_3$ layer 102 has a substantial absence of Yttria, YAG, and YAP phases, as opposed to the typical upper layers generated through the vacuum heat treatment of MCrAlY materials. In typical vacuum heat treatments, where residual oxygen partial pressures on the order of $10^{-5}$ mbar are experienced, the formation of Yttria and mixed Y—Al oxide compounds is expected. These compounds result from the high oxygen affinity of Yttrium driving a Yttrium diffusion from within the bulk of the MCrAlY material, which modifies the originally intended Y-distribution in the heat-treated MCrAlY bondcoat. Additionally, Yttria and mixed Y—Al oxide compounds, particularly large YAG particles, are linked to increased scale spallation due to stress concentration and thermal expansion mismatch. See e.g., Pint, "Optimization of Reactive-Element Additions to Improve Oxidation Performance of Alumina-Forming Alloys," *J. Am. Ceram. Soc.*, 86 [4] (2003). The absence of Yttria, YAG, and YAP phases within Y—$Al_2O_3$ layer 102 is thus a configuration which is both difficult to achieve and advantageous in operational service.

The Y—$Al_2O_3$ layer may be a continuous or discontinuous layer. For example, FIG. 2 illustrates MCrAlY layer 201 in contact with substrate 203 at substrate surface 205, and further in contact with Y—$Al_2O_3$ layer 202 at MCrAlY upper surface 206, where Y—$Al_2O_3$ layer 202 is a discontinuous layer comprised of Y-$Al_2O_3$ regions such as Y-$Al_2O_3$ region 203. When the Y—$Al_2O_3$ layer is comprised of regions such as Y-$Al_2O_3$ region 203, the individual Y-$Al_2O_3$ regions have the same properties as those described for the Y—$Al_2O_3$ layer, such as Y—$Al_2O_3$ layer 102. As such, whether the Y—$Al_2O_3$ layer is a continuous or discontinuous layer is not a limitation of this disclosure. Within this disclosure, it is only necessary that the Y—$Al_2O_3$ layer whether continuous or discontinuous is in contact with the MCrAlY upper surface, and that, when the MCrAlY layer is in contact with a substrate surface, that the Y—$Al_2O_3$ layer is separated from the substrate surface by at least some portion of the MCrAlY layer.

At FIG. 1, MCrAlY layer 101 is comprised of Yttrium and Aluminum, and further comprised of at least 50 wt. % of a metal M, at least 10 wt. % Cr, and at least 7 wt. % Al, where the metal M is Ni, Co, Fe, or combinations thereof, and comprised of phases including a γ-M solid solution, a β-MAl intermetallic phase, and Y-type intermetallics. Depending on the exact chemical composition of MCrAlY layer 101, additional phases may also be present. Generally, the structure of MCrAlY layer 101 is comprised of distinct γ-M solid solution and β-MAl intermetallic phases, with Y-type intermetallics between the phases. In an embodiment, an MCrAlY material utilized to form MCrAlY layer 101 has an MCrAlY composition comprised of from about 15 to about 25 wt. % Chromium, from about 7 to about 15 wt. % Aluminum, from about 0.05 to about 0.5 wt. % Yttrium, and at least 50 wt. % of the base metal M, where the wt. % values are based on the total weight of the composition.

Additionally, MCrAlY layer 101 has a substantial absence of YAG and YAP phases, as opposed to typical MCrAlY bond coats generated through the vacuum heat treatment of MCrAlY materials. Generally, residual oxygen partial pressure in typical vacuum chambers is on the order of $10^{-5}$ mbar, resulting in the formation of mixed Y—Al oxide compounds. Depending on the Yttrium content of the MCrAlY material and the oxygen partial pressure employed, Y—Al oxide compounds can additionally be expected within the bulk of the MCrAlY bond coat layer, along with, in some cases, a generally continuous layer of yttria and significant Yttrium diffusion toward the surface. See e.g., Gil et al., "Y-rich oxide distribution in plasma sprayed MCrAlY-coatings studied by SEM with a cathodoluminescence detector and Raman spectroscopy," *Surface & Coatings Technology* 204 (2009); and see Subanovic et al., "Effect of manufacturing related parameters on oxidation properties of MCrAlY-bondcoats," *Materials and Corrosion* 59 (2008). This generated Y-oxide distribution modifies the Y-distribution within the MCrAlY bulk and has a significant effect on the growth rate and adherence of the alumina scale and lifetime of the bond coat. Additionally, because significant variations in the Y-distribution and the reservoir of metallic Y in MCrAlY coatings can be caused by only minor variations in the processing parameters, the alumina scale growth rate and adherence may be different for nominally the same MCrAlY bondcoats, negatively impacting the reproducibility of bond coat lifetimes. See e.g., Toscano et al., "Parameters affecting TGO growth rate and the lifetime of TBC systems with MCrAlY-bondcoats," *Materials and Corrosion* 59 (2008), among others. Thus, the substantial absence of YAG and YAP phases within MCrAlY layer 101 provides a more uniform and predictable Y-distribution, and significantly mitigates issues associated with Y-oxide formation and altered Y distribution profiles.

When MCrAlY layer 101 is a cast layer, it is expected that MCrAlY layer 101 will additionally have a substantial absence of Yttria in addition to the absences of YAG and YAP phases. However, depending on the method of fabrication, some Yttria formed during application may be unavoidably present. See e.g., Gudmundsson et al., "Yttrium oxides in Vacuum-plasma Sprayed CoNiCrAlY Coatings," *Thin Solid Films,* 173 (1989), among others.

It is known that Yttria, YAG, and YAP exhibit significant cathodoluminescence and may be utilized to determine the morphology and distribution of $Y_2O_3$ and Y—Al mixed oxide phases within MCrAlY coatings. See Gil et al. and see Subanovic et al., among others. Correspondingly, as used herein and above, a "substantial absence" of Yttria, YAG, and YAP phases within Y—$Al_2O_3$ layer 102 means that cathodoluminescence of some portion of Y—$Al_2O_3$ layer 102 generates a CL emission spectra where absorption peaks corresponding to Yttria, YAG, and YAP wavelengths are undetectable above background. Similarly, a "substantial absence" of YAG and YAP phases within MCrAlY layer 101 means that cathodoluminescence of some portion of MCrAlY layer 101 generates a CL emission spectra where absorption peaks corresponding to YAG and YAP wavelengths are undetectable above background.

As stated, MCrAlY layer 101 is comprised of a γ-M solid solution, a β-MAl intermetallic phase, and Y-type intermetallics. As defined, a "Y-type intermetallic" as used here means an intermetallic compound consisting of Yttrium and at least one other metal. For example, when MCrAlY layer 101 derives from a source material composition where the base metal M is Nickel and Cobalt, MCrAlY layer 101 may be comprised of NisY, CosY, and CrsY, among others, as Y-type intermetallics. These intermetallics define a Yttrium atomic concentration within MCrAlY layer 101 which is relatively stable around the original Yttrium atomic concentration of the MCrAlY source material utilized to generate the MCrAlY layer. For example, when the MCrAlY source material has an MCrAlY composition comprised of 0.1 wt. % Yttrium, and MCrAlY layer 101 comprised of γ-M solid solution, a β-MAl intermetallic phase, and Y-type intermetallics results from heat treatment of the MCrAlY source material, the resulting Y-type intermetallics define a Yttrium atomic concentration within MCrAlY layer 101 approximately equivalent 0.1 wt. %. This is distinguished from typical Yttrium containing MCrAlY layers, where even low oxygen partial pressures during heat treatment are sufficient to tie up a significant portion of the MCrAlY source material's Yttrium in Y—Al oxides within the MCrAlY bulk. Additionally, as will be discussed infra, the diffusion of Yttrium toward the surface is mitigated during vacuum heat treatment, resulting in a relatively homogenous Yttrium distribution within MCrAlY layer 101.

Maintaining a significant majority of the Yttrium as a Y-type intermetallic has distinct advantage over MCrAlY layers where a significant portion of the Yttrium component may be tied up in Y—Al oxide inclusions, effectively removing that Yttrium from the available Yttrium reservoir of the MCrAlY layer. There is strong indication that an important life time governing factor of MCrAlY coatings is the Yttrium incorporation into the alumina based Thermal Grown Oxide (TGO) formed during service, which correspondingly generates a decrease of the yttrium concentration in the coating over a component lifetime. If the yttrium concentration is decreased beneath a critical level, its positive effect on TGO adherence is lost, resulting in TGO spallation. See e.g., Toscano et al., "Parameters affecting TGO growth rate and the lifetime of TBC systems with MCrAlY-bondcoats," *Materials and Corrosion* 59 (2008). Thus, within the MCrAlY layer of this disclosure, maintaining a large majority of the Yttrium component in the form of Y-type intermetallics with a substantial absence of Y—Al oxides acts to maximize the Yttrium reservoir of the material, delaying spallation of thermally grown oxides during subsequent service.

In an embodiment, the Yttrium within an MCrAlY layer such as MCrAlY layer 101 defines a Yttrium component, and the Y-type intermetallics within the MCrAlY layer are comprised of at least 90 wt. % of the Yttrium within the Yttrium component. Stated differently, 90 wt. % of the Yttrium in the MCrAlY layer is in the form of a Y-type intermetallic.

As indicated at FIG. 1, MCrAlY layer 101 may be further in contact with substrate surface 105 of substrate 103. In an embodiment, substrate 103 is nickel-base alloy, and the base metal M comprising MCrAlY layer 101 is Ni, Co, or Ni and Co. Additionally, Y—$Al_2O_3$ layer 102 may be further in contact with topcoat 107. In an embodiment, topcoat 107 is comprised of yttria stabilized zirconia.

In a particular embodiment, MCrAlY layer 101 and Y—$Al_2O_3$ layer 102 are fabricated by a process of depositing an MCrAlY material on a substrate, preparing a $Y_2O_3$ paste comprised of a halide activator, and heat treating the article in a non-oxidizing atmosphere to generate the MCrAlY layer and the Y—$Al_2O_3$ layer, as follows:

Depositing the MCrAlY Material on the Substrate:

As earlier defined, an MCrAlY material is a material having a material composition comprised of a base metal M, Chromium, Aluminum, and Yttrium. The base metal M is typically Iron, Nickel, Cobalt, or a combination of Nickel and Cobalt. Generally, the MCrAlY material has an MCrAlY composition comprised of from about 15 to about 25 weight percent (wt. %) Chromium, from about 7 to about 15 wt. % Aluminum, from about 0.05 to about 0.5 wt. % Yttrium, and greater than about 50 wt. % of the base metal M, where the wt. % values are based on the total weight of the composition. In an embodiment, the MCrAlY material has an MCrAlY composition comprised of 22 wt. % Cr, 10 wt. % Al, 1.0 wt. % Y, balance Ni. In another embodiment, an MCrAlY material has an MCrAlY composition of 32 wt. % Ni, 21 wt. % Cr, 8 wt. % Al, 0.5 wt. % Y, balance Co.

The MCrAlY material composition described can be manufactured as a powder for use in depositions using, for example, a spraying technique. The material composition including all elemental constituents may be prepared with powders generated by conventional powder processing methods, such as inert gas atomization from ingots. Alternatively, powder blends may be prepared by mixing separate powders of individual elements or alloys. In a final powder composition prepared in this manner the weight percentage of each elemental constituent corresponds to the ranges earlier provided. A preferred diameter for the metallic powder particles, regardless how formed, is between about 5 to about 50 microns.

Figure 3:
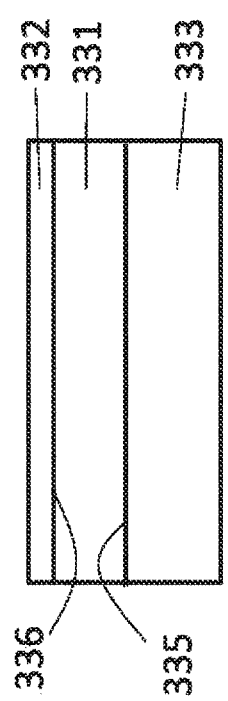
FIG. 3 illustrates an embodiment of a paste covered article comprised of an MCrAlY material and a Y$_2$O$_3$ paste.

The MCrAlY material is deposited as a coating layer on a substrate surface, such as substrate surface 335 of substrate 333 at FIG. 3. The MCrAlY material 331 is deposited using conventional methods, such as low pressure plasma spray (LPPS), electron beam physical vapor deposition (EBPVD), High Velocity Oxygen Fuel (HVOF) spray, or other methods known in the art for deposition of an MCrAlY material onto a substrate surface. See e.g., Pawlowski, *The Science and Engineering of Thermal Spray Coatings* ($2^{nd}$ Ed. 2008). In an embodiment, the MCrAlY material 331 is deposited on the substrate surface to a thickness of about 20 microns. In another embodiment where the base metal M of the MCrAlY material 331 is Nickel or Cobalt, the substrate is comprised of a nickel-base alloy. Deposition of the MCrAlY material 331 onto substrate surface 335 of substrate 333 generates an MCrAlY material surface 336, where the MCrAlY material surface 336 is a surface of the MCrAlY material 331 separated from substrate surface 335 by some portion of MCrAlY material 331.

In an embodiment, the MCrAlY material has an MCrAlY composition comprised of 22 wt. % Cr, 10 wt. % Al, 1.0 wt. % Y, balance Ni, or comprised of 32 wt. % Ni, 21 wt. % Cr, 8 wt. % Al, 0.5 wt. % Y, balance Co, and the MCrAlY material is deposited by atmospheric plasma spray (APS) or high velocity oxygen fuel (HVOF) on a substrate comprised of an advanced Ni-based single crystal alloy, such as RENE N5 developed by General Electric Company, PW 1484 developed by Pratt & Whitney, RR2000 developed by Rolls-Royce, or CMSX-4 developed by Cannon Muskegon Corporation, and the equivalents.

Preparing a $Y_2O_3$ Paste:

The $Y_2O_3$ paste is comprised of $Y_2O_3$ and a halide activator, and may be further comprised of inert filler and inert transport fluid. In an embodiment, the $Y_2O_3$ comprising the $Y_2O_3$ paste is at least 10 wt. % of the combined weight of the $Y_2O_3$, halide activator, and inert filler, and the halide activator is at least about 0.1 wt. % of the combined weight of the $Y_2O_3$ and the halide activator.

$Y_2O_3$ is commercially available as a powder with typical purities of 99.5 wt. % to 99.99 wt. %. Although any particle size may be employed, it has been found advantageous to use particles of relatively fine size. Preferably, the $Y_2O_3$ is relatively fine for ease in suspending in a paste or slurry. Generally, $Y_2O_3$ particle size is less than 200 microns, preferably less than 45 microns, more preferably less than 10 microns.

The halide activator serves to reacts with the $Y_2O_3$ powder during a high temperature coating process to produce yttrium containing vapors which are carried to the MCrAlY upper surface. The halide activator may be selected from any of the activators known for use in the pack cementation technique and suitable for the production of yttrium containing vapors when placed in the presence of $Y_2O_3$ at sufficient temperature. Suitable halide activators may be selected from any of the activators known for this purpose and combinations thereof and equivalents. Typically the halide activator includes one or more halide salts. Suitable halide activators include $AlF_3$, $AlCl_3$, $NH_4F$, $NH_4Cl$, NaF, NaCl, KF, and KCl, among others. In an embodiment, the halide activator is present in an amount of at least about 0.1 wt. % of the combined weight of the $Y_2O_3$ and the halide activator. In an embodiment, the $Y_2O_3$ paste is comprised of 0.5 g NaCl per 150 g $Y_2O_3$.

The inert filler is a material which is not reduced by yttrium-containing vapors and which prevents the sintering of $Y_2O_3$. Generally, the inert filler may comprise 10 wt. % to 80 wt. % of the $Y_2O_3$ paste. Fillers are known in the art that inhibit sintering of $Y_2O_3$ and include alumina, thoria, calcia, zirconia and other stable and inert refractory oxides and mixtures thereof. The inert filler may be added in the same particle size range as the $Y_2O_3$, with typical particle size less than 200 microns, preferably less than 45 microns, more preferably less than 10 microns.

The $Y_2O_3$, halide activator and optionally, inert filler, are combined and thoroughly mixed as required to make the $Y_2O_3$ paste composition. An inert transport fluid such as water may be added, generally in an amount of about 30 wt % to 40 wt % of the $Y_2O_3$ paste. In an embodiment, the $Y_2O_3$ paste is comprised of 0.5 g NaCl and 150 g $Y_2O_3$ per 100 cc of water. This is stirred until it has a consistence of about milk or cream. Frequent stirring or continuous stirring during application provides the best coating.

Applying the $Y_2O_3$ Paste and Heating the Paste Covered Article:

The $Y_2O_3$ paste is applied to the MCrAlY material surface by any convenient, cost effective manner. Dipping, brushing and spraying are all effective. In an embodiment, the $Y_2O_3$ paste is applied to the MCrAlY material surface in a layer less than about 1 micron thick. FIG. 3 illustrates $Y_2O_3$ paste 332 applied to MCrAlY material surface 336. Application of $Y_2O_3$ paste 332 to MCrAlY material surface 336 generates a paste covered article, where the paste covered article is comprised of substrate 333, MCrAlY material 331, and $Y_2O_3$ paste 332, where MCrAlY material 331 is in contact with substrate 333 at substrate surface 335 and further in contact with $Y_2O_3$ paste 332 at MCrAlY material surface 336, and where $Y_2O_3$ paste 332 is separated from substrate 333 by at least some portion of MCrAlY material 331, as illustrated at FIG. 3. In an embodiment, an topcoat material such as yttria stabilized zirconia is then applied to the surface of the $Y_2O_3$ layer.

The paste covered article is then heated in a non-oxidizing atmosphere at a temperature of from about 400° C. to about 1300° C. for a sufficient period of time sufficient to generate the MCrAlY layer and the Y—$Al_2O_3$ layer, where the MCrAlY layer and the Y—$Al_2O_3$ layer have properties as described. In an embodiment, the paste covered article is heated at a temperature of about 900° C. for a period of about 2 hours. A "non-oxidizing atmosphere" as used in this disclosure means an atmosphere having either a total pressure or partial pressure of oxygen less than about $10^{-3}$ mbar.

Following the heating period, any excess remaining $Y_2O_3$ paste may be removed from the heat treated article, generating a bond coated article.

The method as described above may be utilized for the production of the bond coated article comprised of the Y—$Al_2O_3$ layer and the MCrAlY layer as described. Without being bound by theory, it is believed that utilization of the $Y_2O_3$ paste in the non-oxidizing atmosphere as described acts to severely mitigate the diffusion of any residual oxygen existing during the heat treatment prescribed. This residual oxygen is typically present in vacuum heat treatment furnaces, which generally exhibit oxygen pressures on the order of $10^{-5}$ mbar during operation. As is understood, Yttrium has the highest oxygen affinity in typical MCrAlY materials, and Yttria is generally the first oxide to form during early oxidation stages. The low oxygen pressure exhibited by standard vacuum heat furnaces is sufficient to generate a strong diffusion of Yttrium within the MCrAlY material toward the surface and subsequent oxidation, as well as the formation of YAG and YAP phases within the MCrAlY bulk. The method as described above allows the formation of a bond coated article comprised of the Y—$Al_2O_3$ layer and the MCrAlY layer as described by blocking oxygen diffusion into the MCrAlY bulk during heat treatment, resulting in a Y—$Al_2O_3$ layer comprised of equiaxed grains of $Al_2O_3$ enriched with Yttrium at grain-boundary cation sites and having a substantial absence of Yttria, YAG, and YAP phases, and an MCrAlY layer in contact with the Y—$Al_2O_3$ layer, where the MCrAlY layer is comprised of γ-M solid solution, β-MAl intermetallics, and Y-type intermetallics with a substantial absence of YAG and YAP phases. The produced material thus avoids significant variation in the intended Y-distribution and the reservoir of metallic Y in MCrAlY coatings, and mitigates the negative impacts to bond coat lifetimes.

It is to be understood that the above-described arrangements are only illustrative of the application of the principles of the present invention and it is not intended to be exhaustive or limit the invention to the precise form disclosed. Numerous modifications and alternative arrangements may be devised by those skilled in the art in light of the above teachings without departing from the spirit and scope of the present invention. It is intended that the scope of the invention be defined by the claims appended hereto.

In addition, the previously described versions of the present invention have many advantages, including but not limited to those described above. However, the invention does not require that all advantages and aspects be incorporated into every embodiment of the present invention.

All publications and patent documents cited in this application are incorporated by reference in their entirety for all purposes to the same extent as if each individual publication or patent document were so individually denoted.

What is claimed is:

1. A method of producing a bond coat comprising:
   depositing an MCrAlY material to a substrate surface of a substrate, where the MCrAlY material is comprised of chromium, aluminum, yttrium, and a base metal M, where the base metal M is Ni, Co, Fe, or combinations thereof, thereby generating an MCrAlY material surface, where the MCrAlY material surface is a surface of the MCrAlY material separated from the substrate surface by some portion of the MCrAlY material;
   applying a $Y_2O_3$ paste to the MCrAlY material surface, where the $Y_2O_3$ paste is comprised of $Y_2O_3$ and a halide activator, balance inert filler and inert transport fluid, and where the $Y_2O_3$ is at least 10 wt. % of the combined weight of the $Y_2O_3$, halide activator, and inert filler, and where the halide activator is at least about 0.1 wt. % of the combined weight of the $Y_2O_3$ and the halide activator, thereby generating a $Y_2O_3$ upper surface, where the $Y_2O_3$ upper surface is a surface of the $Y_2O_3$ paste separated from the MCrAlY material surface by some portion of the $Y_2O_3$ paste, and thereby forming a paste covered article;
   heating the paste covered article at a temperature of about 400° C. to about 1300° C. in a non-oxidizing atmosphere for a period of time, where the period of time is sufficient to generate an MCrAlY layer and a Y—$Al_2O_3$ layer, where the MCrAlY layer is comprised of γ-M solid solution, β-MAl intermetallic, and Y-type intermetallics, and the Y—$Al_2O_3$ layer is comprised of Yttrium atoms and $Al_2O_3$, where the Yttrium atoms are coordinated with oxygen atoms comprising the $Al_2O_3$, and where the Y—$Al_2O_3$ layer is in contact with the MCrAlY layer, thereby generating a heat treated article; and
   removing any remaining $Y_2O_3$ paste from the heat treated article, thereby generating a bond coated article, where the bond coated article is comprised of the bond coat.

2. The method of claim 1 where the MCrAlY material is comprised of at least 7 wt. % aluminum, less than about 25 wt. % chromium, from about 0.05 to about 1.5 wt. % yttrium, and greater than about 50 wt. % of the base metal M.

3. The method of claim 2 where the paste covered article has a MCrAlY material thickness and a $Y_2O_3$ paste thickness, where the MCrAlY material thickness is a first distance measured in a direction substantially normal to the substrate surface and between the substrate surface and the MCrAlY material surface, where the $Y_2O_3$ paste thickness is a second distance measured in a direction substantially normal to the substrate surface and between the MCrAlY material surface and the $Y_2O_3$ upper surface, and where the MCrAlY material thickness is less than about 20 microns thick and the $Y_2O_3$ paste thickness is less than about 1 micron thick.

4. The method of claim 3 further comprised of applying a topcoat material to the $Y_2O_3$ upper surface of the paste covered article.

5. The method of claim 4 where the topcoat material is comprised of yttria stabilized zirconia.

6. The method of claim 2 where the MCrAlY material is comprised of from about 15 to about 25 wt. % chromium and from about 10 to about 15 wt. % aluminum.

7. The method of claim 6 where the non-oxidizing atmosphere has a partial pressure of oxygen less than about $10^{-3}$ mbar.

8. The method of claim 7 where the substrate is comprised of a nickel-base alloy, and where the base metal M is Ni, Co, or Ni and Co.

9. The method of claim 8 where the MCrAlY material is comprised of less than about 0.15 wt. % Yttrium.

10. The method of claim 7 where the temperature is about 900° C. to about 1300° C. and the period of time is greater than or equal to 2 hours.

11. The method of claim 7 where the MCrAlY layer and the Y—$Al_2O_3$ layer have a substantial absence of Yttrium-Aluminum Garnet and Yttrium-Aluminum Perovskite.

12. A method of producing a bond coat comprising:
    depositing an MCrAlY material to a substrate surface of a substrate, where the MCrAlY material is comprised of at least 7 wt. % aluminum, less than about 25 wt. % chromium, from about 0.05 to about 1.5 wt. % yttrium, and greater than about 50 wt. % of a base metal M, where the metal base M is Ni, Co, or Ni and Co, thereby generating an MCrAlY material surface, where the MCrAlY material surface is a surface of the MCrAlY material separated from the substrate surface by some portion of the MCrAlY material;
    applying a $Y_2O_3$ paste to the MCrAlY material surface, where the $Y_2O_3$ paste is comprised of $Y_2O_3$ and a halide activator, balance inert filler and inert transport fluid, and where the $Y_2O_3$ is at least 10 wt. % of the combined weight of the $Y_2O_3$, halide activator, and inert filler, and where the halide activator is at least about 0.1 wt. % of the combined weight of the $Y_2O_3$ and the halide activator, thereby generating a $Y_2O_3$ upper surface, where the $Y_2O_3$ upper surface is a surface of the $Y_2O_3$ paste separated from the MCrAlY material surface by some portion of the $Y_2O_3$ paste, and thereby forming a paste covered article;
    heating the paste covered article at a temperature of about 400° C. to about 1300° C. in a non-oxidizing atmosphere for a period of time, where the period of time is sufficient to generate an MCrAlY layer and a Y—$Al_2O_3$ layer, where the MCrAlY layer is comprised of γ-M solid solution, β-MAl intermetallic, and Y-type intermetallics, and the Y—$Al_2O_3$ layer is comprised of Yttrium atoms and $Al_2O_3$, where the Yttrium atoms are coordinated with oxygen atoms comprising the $Al_2O_3$, and where the Y—$Al_2O_3$ layer is in contact with the MCrAlY layer, thereby generating a heat treated article; and removing any remaining $Y_2O_3$ paste from the heat treated article, thereby generating a bond coated article, where the bond coated article is comprised of the bond coat.

13. The method of claim 12 where the MCrAlY material is comprised of from about 15 to about 25 wt. % chromium and from about 10 to about 15 wt. % aluminum.

14. The method of claim 13 where the substrate is comprised of a nickel-base alloy.

15. The method of claim 14 where the paste covered article has a MCrAlY material thickness and a $Y_2O_3$ paste thickness, where the MCrAlY material thickness is a first distance measured in a direction substantially normal to the substrate surface and between the substrate surface and the MCrAlY material surface, where the $Y_2O_3$ paste thickness is a second distance measured in a direction substantially normal to the substrate surface and between the MCrAlY material surface and the $Y_2O_3$ upper surface, and where the MCrAlY material thickness is less than about 20 microns thick and the $Y_2O_3$ paste thickness is less than about 1 micron thick.

16. The method of claim 15 where the non-oxidizing atmosphere has a partial pressure of oxygen less than about $10^{-3}$ mbar.

17. The method of claim 16 where the period of time is greater than or equal to 2 hours.

18. The method of claim 17 further comprised of applying a topcoat material to the $Y_2O_3$ upper surface of the paste covered article.

19. The method of claim 18 where the topcoat material is comprised of yttria stabilized zirconia.

20. The method of claim 17 where the temperature is about 900° C. to about 1300° C.

21. The method of claim 20 where the MCrAlY layer has a yttrium component, where the yttrium component is the weight percent of yttrium within the MCrAlY layer, and where the Y-type intermetallics comprise of at least 90 wt. % of the yttrium within the yttrium component, and where the MCrAlY layer and the Y—$Al_2O_3$ layer have a substantial absence of Yttrium-Aluminum Garnet and Yttrium-Aluminum Perovskite.

* * * * *